(12) United States Patent
Jee et al.

(10) Patent No.: US 10,935,423 B2
(45) Date of Patent: Mar. 2, 2021

(54) LIGHT-TO-DIGITAL CONVERTER

(71) Applicant: AJOU UNIVERSITY INDUSTRY-ACADEMIC COOPERATION FOUNDATION, Suwon-si (KR)

(72) Inventors: Dong Woo Jee, Suwon-si (KR); Hyung Gi Kim, Suwon-si (KR)

(73) Assignee: AJOU UNIVERSITY INDUSTRY-ACADEMIC COOPERATION FOUNDATION, Suwon-si (KR)

(*) Notice: Subject to any disclaimer, the term of this patent is extended or adjusted under 35 U.S.C. 154(b) by 0 days.

(21) Appl. No.: 16/474,378

(22) PCT Filed: Jan. 3, 2018

(86) PCT No.: PCT/KR2018/000093
§ 371 (c)(1),
(2) Date: Jun. 27, 2019

(87) PCT Pub. No.: WO2018/128370
PCT Pub. Date: Jul. 12, 2018

(65) Prior Publication Data
US 2019/0339121 A1    Nov. 7, 2019

(30) Foreign Application Priority Data
Jan. 3, 2017  (KR) .................. 10-2017-0000642

(51) Int. Cl.
*H03M 1/00*  (2006.01)
*G01J 1/44*  (2006.01)
(Continued)

(52) U.S. Cl.
CPC .............. *G01J 1/44* (2013.01); *H03M 3/458* (2013.01); *G01J 2001/446* (2013.01); *H03K 19/21* (2013.01)

(58) Field of Classification Search
CPC ........ H03M 3/43; H03M 3/456; H03M 3/458; H03M 3/496; H03M 3/39; H03M 3/454; H03M 3/424; H03M 3/47; H03M 3/482; H03M 7/3006; H03M 7/3031; H03M 1/002; H03M 1/12; H03M 3/344; H03M 3/448; H03M 3/486; H03M 3/02; H04N 5/378;
(Continued)

(56) References Cited
U.S. PATENT DOCUMENTS 5,461,428 A * 10/1995 Yoo ..................... H04N 5/44513
                                                        348/558
8,300,116 B2 * 10/2012 Kwon .................... H04N 5/378
                                                        348/222.1
(Continued)

*Primary Examiner* — Linh V Nguyen
(74) *Attorney, Agent, or Firm* — Sughrue Mion, PLLC

(57) ABSTRACT

A light-to-digital converter of the present invention includes: a plurality of light-to-digital conversion units each creating a first clock signal by performing delta-sigma conversion on a photodiode voltage created from an unbiased photodiode, and outputting a unit output signal obtained by synchronizing the first clock signal with a second clock signal that is a reference clock signal; and an adder outputting a digital output signal by adding up the unit output signals of the plurality of light-to-digital conversion units.

9 Claims, 7 Drawing Sheets

(51) Int. Cl.
*H03M 3/00* (2006.01)
*H03K 19/21* (2006.01)

(58) Field of Classification Search
CPC .... H04N 5/3765; H04N 5/374; H04N 5/3698;
H04N 5/3575; H04N 5/365; H04N
5/35554; H04N 5/37455; H04N 5/335;
H04N 5/343; H04N 5/345; H04N 5/3452
USPC .................................. 341/137, 143, 165, 166
See application file for complete search history.

(56) References Cited

U.S. PATENT DOCUMENTS

| | | | |
|---|---|---|---|
| 9,264,643 B1* | 2/2016 | Xue | H04N 5/3575 |
| 2003/0107671 A1* | 6/2003 | Castro | H04N 5/37455 |
| | | | 348/395.1 |
| 2006/0027730 A1* | 2/2006 | Bamji | G01S 7/4863 |
| | | | 250/208.1 |
| 2010/0013969 A1* | 1/2010 | Ui | H04N 5/35545 |
| | | | 348/294 |
| 2016/0141327 A1* | 5/2016 | Verdant | H03M 3/394 |
| | | | 250/208.1 |
| 2016/0327904 A1* | 11/2016 | Laforest | G03H 1/0465 |
| 2017/0126245 A1* | 5/2017 | Shem | H01L 27/14609 |
| 2017/0201700 A1* | 7/2017 | Hashimoto | H04N 5/37455 |
| 2018/0020175 A1* | 1/2018 | Nayar | H01L 27/14643 |
| 2019/0356328 A1* | 11/2019 | Ben Shem | H03M 3/458 |

* cited by examiner

[FIG. 1]
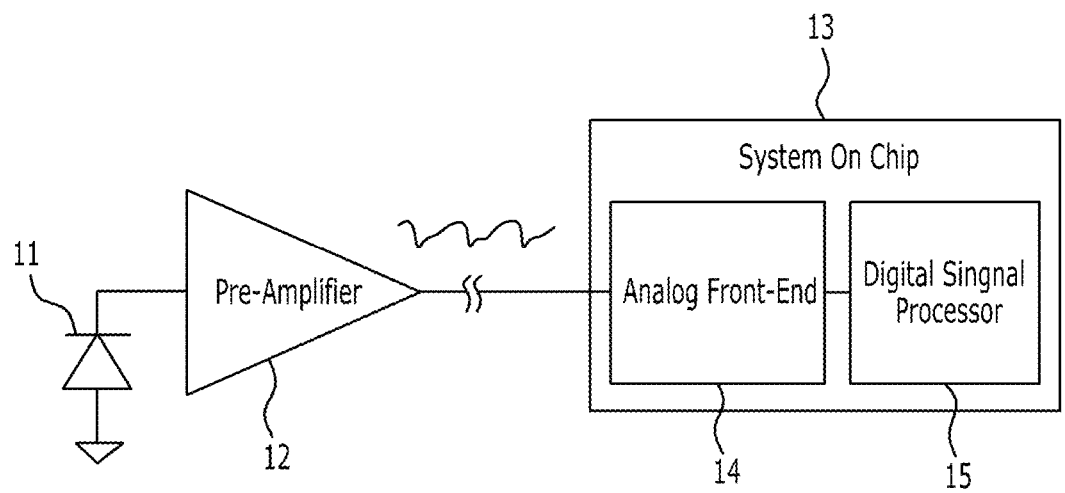
[FIG. 2]
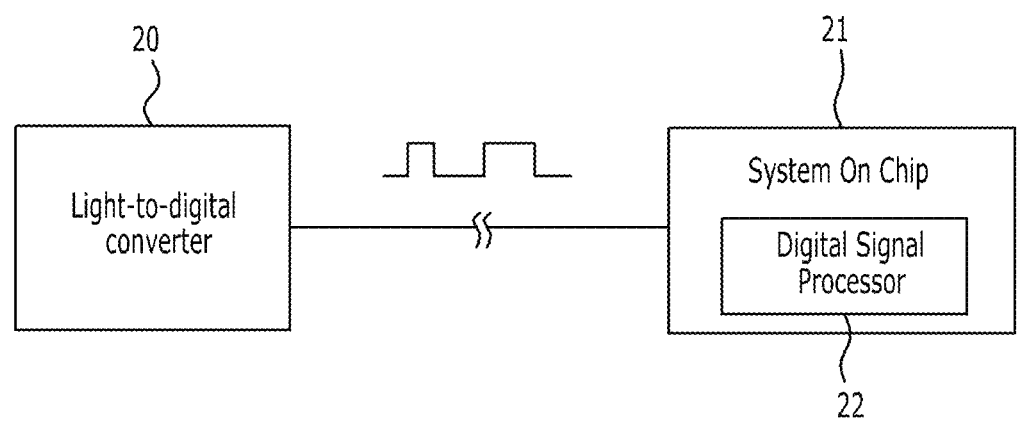

[FIG. 3]
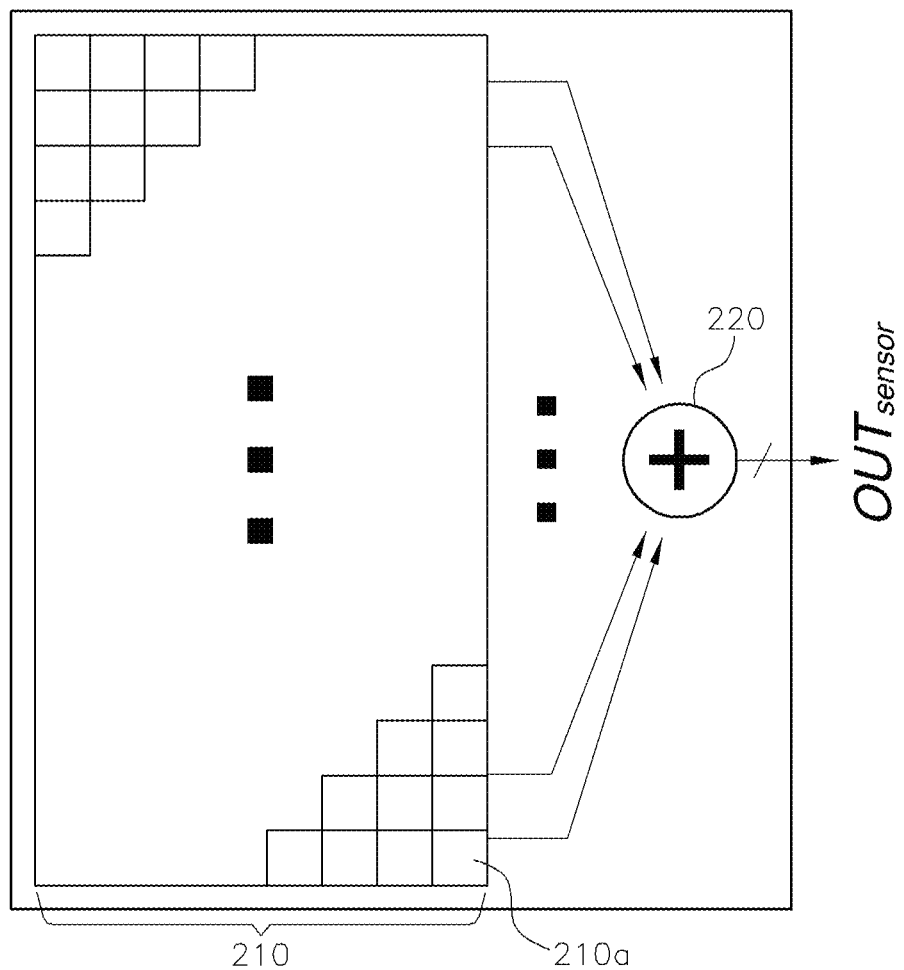

[FIG. 4]
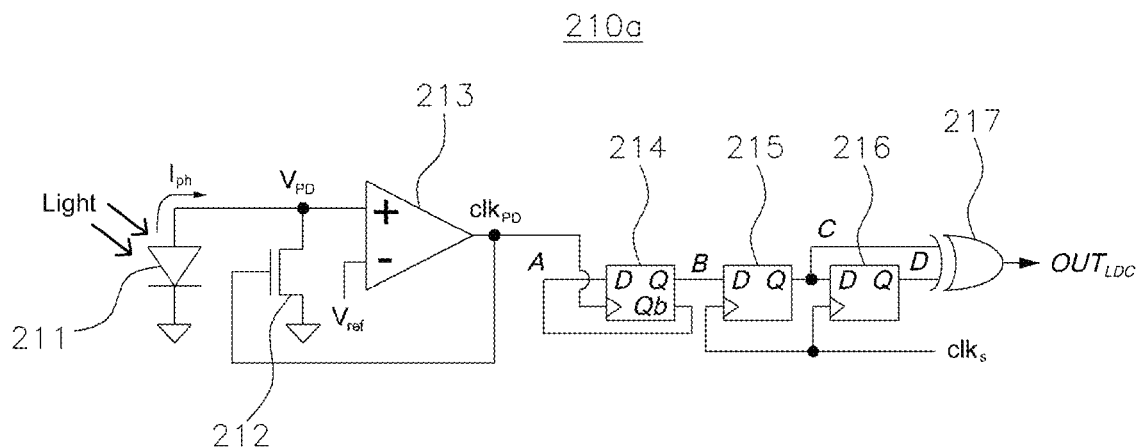
[FIG. 5]
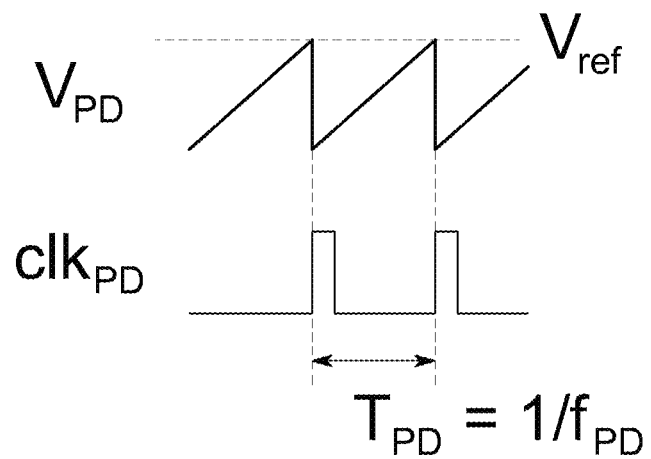
If $V_{ref} < V_{oc}$, $f_{PD} \propto$ light

[FIG. 6]
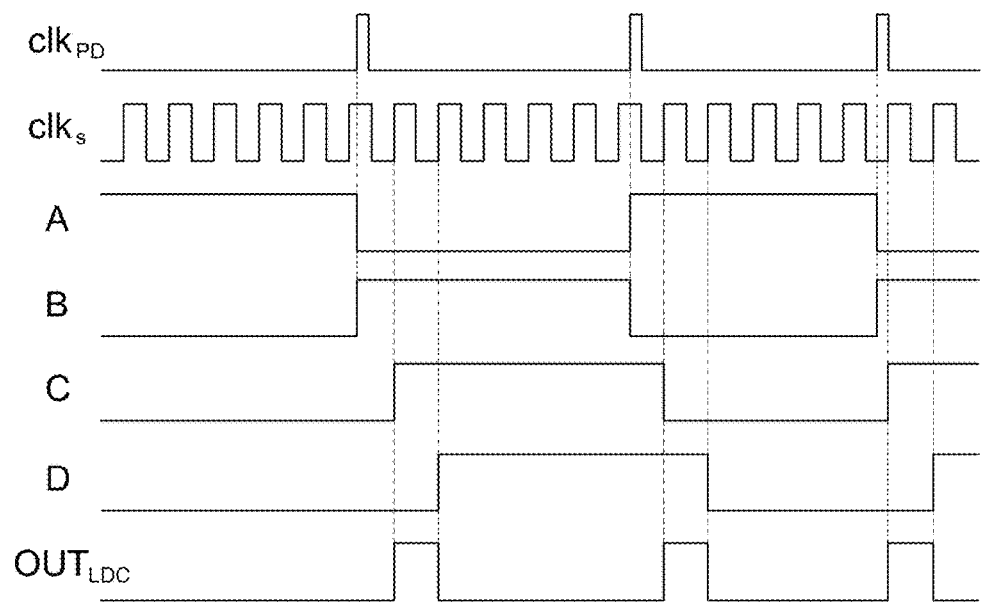
[FIG. 7]
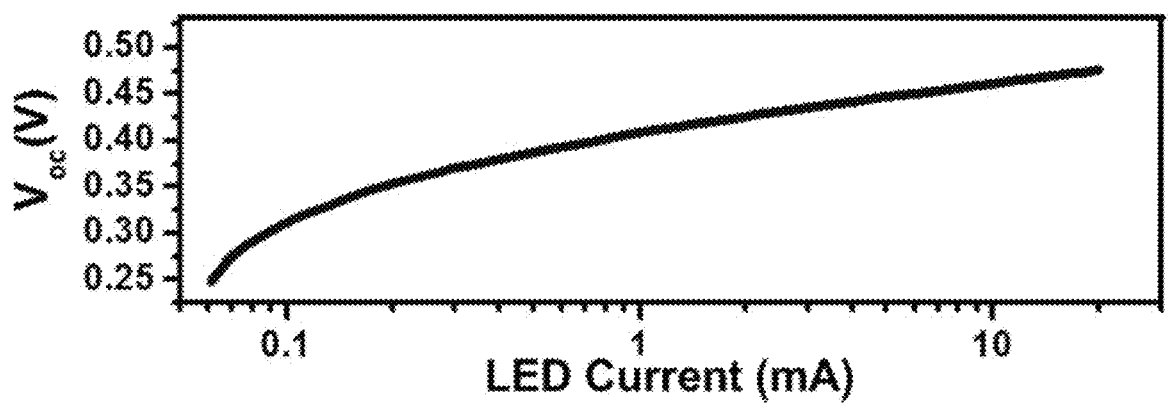

[FIG. 8]
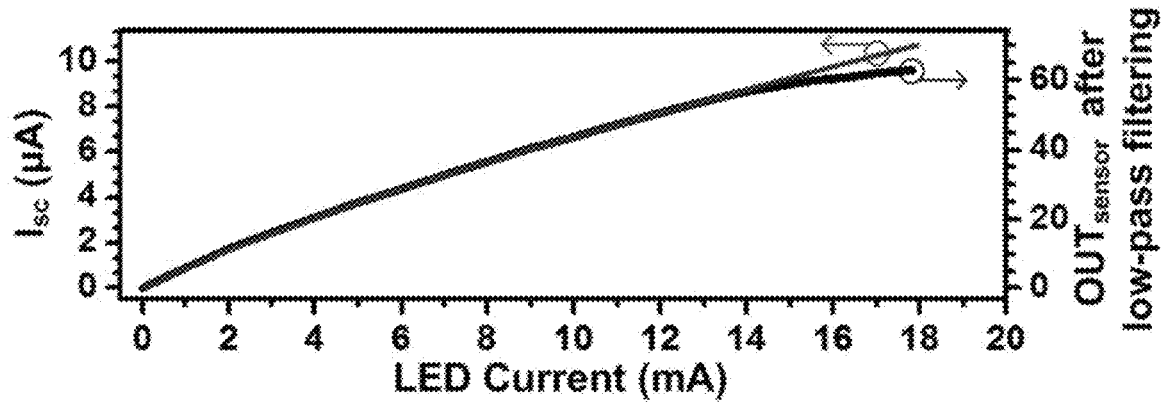
[FIG. 9]
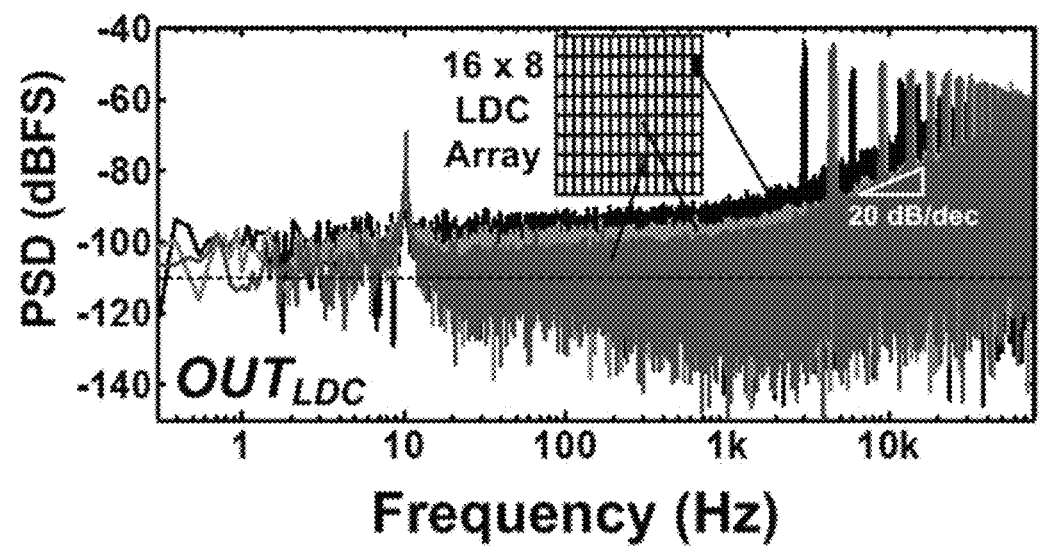

[FIG. 10]
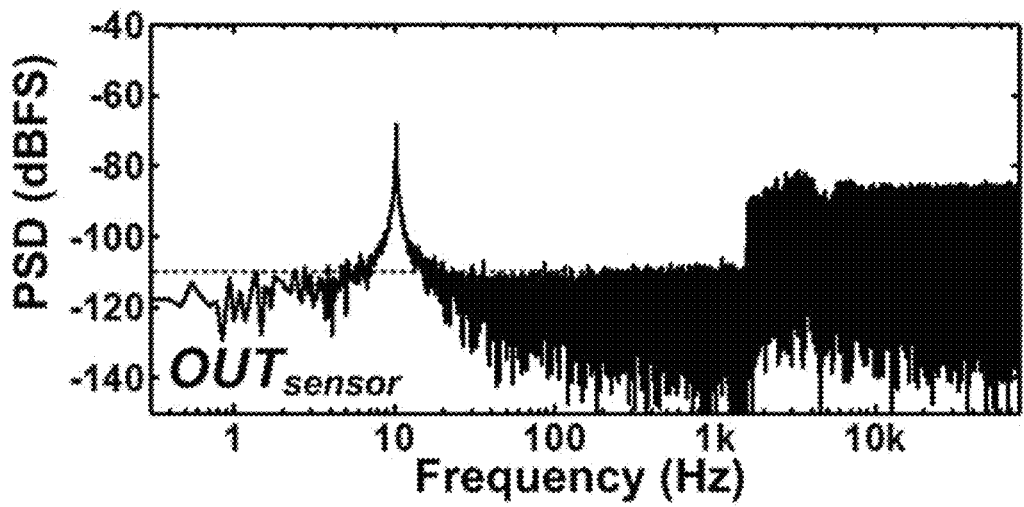
[FIG. 11]
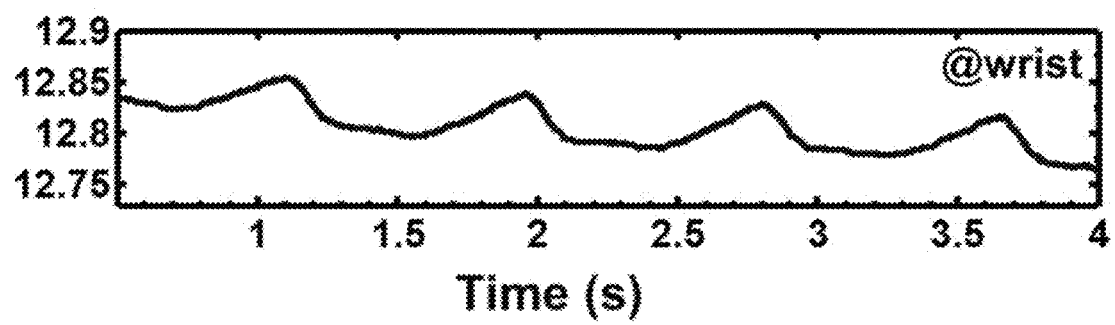
[FIG. 12]
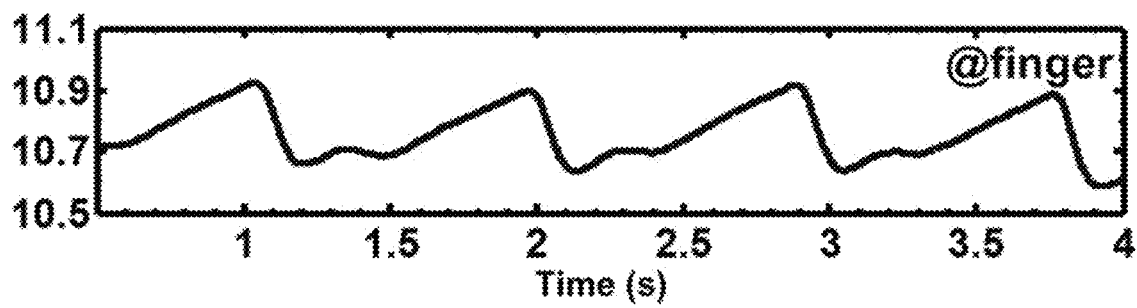

[FIG. 13]
|  | This Work | Conventional 1 | Conventional 2 | Conventional 3 |
|---|---|---|---|---|
| Process | 0.18 μm | 0.18 μm | 0.18 μm | 0.18 μm |
| Power | 14~25 μW | 172 μW* | 148 μW* | 4 μW |
| Noise | 18.2 pA$_{rms}$ | 486 pA$_{rms}$ | 600 pA$_{rms}$ | N.A. |
| BW | 0.5-10 Hz | 10 Hz | 10 Hz | 0.5-5 Hz |
| Sampling | 160 kHz | 128 Hz | 165 Hz | 32 kHz |
| Monolithic | Yes | No | No | No |
| PPG Measurement | Reflective, Wrist / Finger | Transmissive, Finger | Reflective, Finger | Transmissive, Finger |
[FIG. 14]
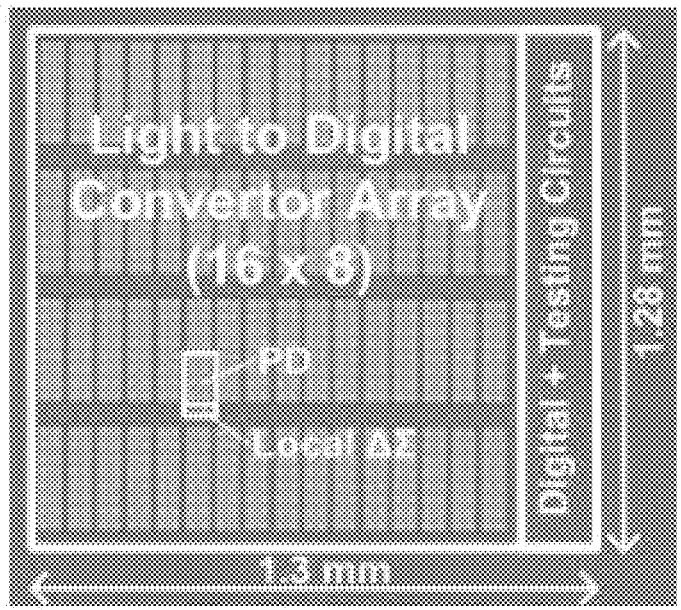

LIGHT-TO-DIGITAL CONVERTER

CROSS REFERENCE TO RELATED APPLICATIONS

This application is a National Stage of International Application No. PCT/KR2018/000093 filed Jan. 3, 2018, claiming priority based on Korean Patent Application No. 10-2017-0000642 filed Jan. 3, 2017.

TECHNICAL FIELD

The present invention relates to a light-to-digital converter.

BACKGROUND ART

PPG (Photoplethysmography) is a sensing technique that is most used in wearable devices for monitoring a heart rate. Since measuring an optical signal change according to a change of a blood rate is the main principle, a PPG sensor system includes a photodiode (PD) 101 converting an optical signal into a current signal, a high-performance analog front-end (AFE) 104 converting a current signal into a digital datum, and a digital signal processor 105 for extracting a heart rate (see FIG. 1).

Recently, due to technological progress, it has been possible to integrate PPG readout in a system-on-chip (SoC) 103 and downsize wearable systems (see non-patent document 1).

However, the high-performance analog front-end 104 acts as an important bottleneck in design and technology scaling of the system-on-chip 103. In addition, there is a problem that a pre-amplifier IC 102 that needs a large amount of power and area is required to amplify small current output from the photodiode 101.

The photodiode 101 needs to be positioned at an optimal place for acquiring bio signals (e.g., the inside of a wrist), so transmission of analog signals to the system-on-chip 103 may require a length of about 7 to 10 cm in terms of statistical wrist girths. Further, there is a problem that it is very vulnerable to noise coupling even if the pre-amplifier 102 is included.

DISCLOSURE

Technical Problem

An object of the present invention is to provide a light-to-digital converter that implements low power because it does not need a bias voltage for a photodiode, and that simplifies the configuration of each unit and achieves low noise level by configuration a plurality of light-to-digital conversion units in an array.

Technical Solution

A light-to-digital converter according to an embodiment of the present invention includes: a plurality of light-to-digital conversion units each creating a first clock signal by performing delta-sigma conversion on a photodiode voltage created from an unbiased photodiode, and outputting a unit output signal obtained by synchronizing the first clock signal with a second clock signal that is a reference clock signal; and an adder outputting a digital output signal by adding up the unit output signals of the plurality of light-to-digital conversion units.

Light-incident surfaces of the plurality of light-to-digital conversion units may be disposed in an array format with respect to one plane.

The plurality of light-to-digital conversion units each may have a non-inverting terminal connected with an anode of the photodiode and an inverting terminal connected with a reference voltage, and further include a comparer.

The plurality of light-to-digital conversion units each may further include a transistor receiving input of the first clock signal through a gate terminal and having one end connected to a non-inverting terminal of the comparer.

A cathode of the photodiode and the other end of the transistor of each of the plurality of light-to-digital conversion units may be connected to a ground terminal.

The plurality of light-to-digital conversion units each may further include a first flip-flop receiving input of the first clock signal through a clock terminal and having an input terminal and an inverting output terminal connected with each other.

The plurality of light-to-digital conversion units each may further include a second flip-flop receiving input of a second clock signal through a clock terminal and having an input terminal connected with an output terminal of the first flip-flop.

The plurality of light-to-digital conversion units each may further include a third flip-flop receiving input of the second clock signal through a clock terminal and having an input terminal connected with an output terminal of the second flip-flop.

The plurality of light-to-digital conversion units each may further include an XOR gate outputting a unit output signal by receiving input from the output terminal of the second flip-flop and the output terminal of the third flip-flop.

A light-to-digital conversion unit according to an embodiment of present invention includes: a photodiode; a comparer having a non-inverting terminal connected with an anode of the photodiode and an inverting terminal connected with a reference voltage, and outputting a first clock signal; and a transistor receiving input of the first clock signal through a gate terminal and having one end connected with the non-inverting terminal of the comparer.

A cathode of the photodiode and the other end of the transistor may be connected to a ground terminal.

The light-to-digital conversion unit may further include: a first flip-flop receiving input of the first clock signal through a clock terminal and having an input terminal and an inverting output terminal connected to each other; a second flip-flop receiving input of a second clock signal through a clock terminal and having an input terminal connected with an output terminal of the first flip-flop; a third flip-flop receiving input of second clock signal through a clock terminal and having an input terminal connected with an output terminal of the second flip-flop; and an XOR gate outputting a unit output signal by receiving input from the output terminal of the second flip-flop and the output terminal of the third flip-flop.

Advantageous Effects

The light-to-digital converter according to the present invention can implement low power because it does not need a bias voltage for a photodiode, and the converter can simplify the configuration of each unit and achieve low noise level by configuration a plurality of light-to-digital conversion units in an array.

DESCRIPTION OF DRAWINGS

FIG. 1 is a diagram for illustrating a PPG sensor system according to the related art.

FIG. 2 is a diagram for illustrating a PPG sensor system according to an embodiment of the present invention.

FIG. 3 is a diagram for illustrating a light-to-digital converter according to an embodiment of the present invention.

FIG. 4 is a diagram for illustrating a light-to-digital conversion unit according to an embodiment of the present invention.

FIG. 5 is a diagram for illustrating the relationship of a first clock signal, a reference voltage, and a photodiode voltage.

FIG. 6 is a diagram for illustrating signal transmission relationship until a unit output signal is output.

FIG. 7 is a diagram for illustrating an open voltage of a photodiode to an LED current value.

FIG. 8 is a diagram for illustrating a short current of a photodiode to an LED current value.

FIG. 9 is a diagram for illustrating the result of an FFT process on a unit output signal of three light-to-digital conversion units exemplarily selected.

FIG. 10 is a diagram for illustrating the result of an FFT process on a digital output signal of a light-to-digital converter.

FIG. 11 is a diagram for illustrating a PPG signal measured at a wrist.

FIG. 12 is a diagram for illustrating a PPG signal measured at a finger.

FIG. 13 is a table for comparing the performance of a light-to-digital converter according to an embodiment of the present invention and the related art.

FIG. 14 is a diagram for illustrating an exemplary configuration of a light-to-digital converter according to an embodiment of the present invention.

BEST MODE

Hereafter, several embodiments of the present invention will be described in detail with reference to the accompanying drawings for those skilled in the art to easily achieve the present invention. The present invention may be implemented in various different ways and is not limited to the embodiments described herein.

In the accompanying drawings, portions unrelated to the description will be omitted in order to obviously describe the present invention, and similar reference numerals will be used to describe similar portions throughout the present specification. Accordingly, previously described reference numerals may be used in other drawings.

Further, the sizes and thicknesses of the components shown the figures are selectively provided for the convenience of description and the present invention is not necessarily limited thereto. Thicknesses may be exaggerated to clearly show several layers and regions in the drawings.

FIG. 2 is a diagram for illustrating a PPG sensor system according to an embodiment of the present invention.

Referring to FIG. 2, a PPG sensor system according to an embodiment of the present invention includes a light-to-digital converter 20 and a system-on-chip 21.

As described above, the system-on-chip 21 includes a digital signal processor 22 for extraction heart rate information from a digital signal.

The system-on-chip 21 of the PPG sensor system according to the present embodiment does not include a separate analog front-end (AFE), which is because a digital signal may be directly output from the light-to-digital converter 20.

According to the present embodiment, since a digital signal is directly output from the light-to-digital converter 20, there is the advantage that there is no need for a separate analog front-end that is required for digital signal conversion. Further, the path from the light-to-digital converter 20 to the system-on-chip 21 may require a transmission path of a length of about 7 to 10 cm in terms of statistical wrist girths, and accordingly, a characteristic that is strong against noise is obtained even though a pre-amplifier is not included because digital signals are transmitted.

Hereafter, an exemplary PPG sensor system of 25 uW or less that performs direct light-to-digital conversion in a single die through a CMOS logic process is described. A monolithic sensor with a structure according to an embodiment of the present invention may minimize system costs and noise coupling and may make technology scaling of a system-on-chip easier.

FIG. 3 is a diagram for illustrating a light-to-digital converter according to an embodiment of the present invention.

Referring to FIG. 3, the light-to-digital converter 20 according to an embodiment of the present invention includes a plurality of light-to-digital conversion units 210 and an adder 220.

The plurality of light-to-digital conversion units 210 each may include an unbiased photodiode. The unbiased photodiodes will be described later with reference to FIG. 4. Referring to FIG. 3, the plurality of light-to-digital conversion units 210 is disposed in a rectangular array format, but may be disposed in appropriate shapes in accordance with embodiments. For example, when the PPG sensor system uses a finger of a user as a target and when it uses a wrist of a user as a target, the gaps and disposition shape of the plurality of light-to-digital conversion units 210 may be different from each other. Further, the light-incident surfaces of the plurality of light-to-digital conversion units may be disposed in an array format with respect to one plane, depending on embodiments (see FIGS. 3 and 14).

It is assumed hereafter that 128 light-to-digital conversion units 210 are distributed and disposed in an array format of 16×8. An anode voltage generated by light may be converted into a delta-sigma modulated 1b stream. This will be described later with reference to FIG. 4.

The adder 220 outputs a digital output signal $OUT_{sensor}$ by adding up output of the plurality of light-to-digital conversion units 210. Depending on embodiments, the adder 220 may receive 128 1b stream inputs (1b 128-input adder).

PPG sensing considers only the entire amount of received light and a change thereof, so the adder 220 may output a digital output signal $OUT_{sensor}$ that has undergone signal conversion by simply adding up the output of the plurality of light-to-digital conversion units 210. Meanwhile, light input is widely distributed to the plurality of light-to-digital conversion units 210, so there is an advantage that the dynamic range requirement of each of the light-to-digital conversion units 210 themselves may be considerably attenuated.

FIG. 4 is a diagram for illustrating a light-to-digital conversion unit according to an embodiment of the present invention.

Referring to FIG. 4, a light-to-digital conversion unit 210a according to an embodiment of the present invention includes an unbiased photodiode 211. Depending on embodiments, the light-to-digital conversion unit 210a may further include a comparer 213, a transistor 212, a first flip-flop 214, a second flip-flop 215, a third flip-flop 216, and an XOR gate 217.

The light-to-digital conversion unit 210a, for example, may include a p-n diode of 128 um×64 um as a photodiode 211. Depending on embodiments, a cathode of the photodiode may be connected to a ground terminal and an anode may not be biased. Unlike the related art, there is no need for a bias driver required for biasing the photodiode 211, so the light-to-digital conversion unit 210a of the present embodiment is advantageous in terms of power consumption and may be integrated in a small area.

The light-to-digital conversion unit 210a of the present embodiment may create a first clock signal $clk_{PD}$ by performing delta-sigma conversion on a photodiode voltage $V_{PD}$ created from the photodiode 211. The delta-sigma conversion may be performed through the comparer 213 and the transistor 212 that is fed back output of the comparer 213.

Further, depending on embodiments, the light-to-digital conversion unit 210a may output a unit output signal $OUT_{LDC}$ obtained by synchronizing the first clock signal $clk_{PD}$ with a second clock signal $clk_s$ that is a reference clock signal to the adder 220. This synchronization process may be performed by the first flip-flop 214, the second flip-flop 215, the third flip-flop 216, and the XOR gate 217.

The comparer 213 has a non-inverting terminal connected with the anode of the photodiode 211 and an inverting terminal connected with a reference voltage $V_{ref}$, and may output the first clock signal $clk_{PD}$.

For example, the comparer 213 may output a signal corresponding to the difference between the photodiode voltage $V_{PD}$ and the reference voltage $V_{ref}$ as the first clock signal $clk_{PD}$. When the photodiode voltage $V_{PD}$ is larger than the reference voltage $V_{ref}$, a positive value is output, and the photodiode voltage $V_{PD}$ is smaller than the reference voltage $V_{ref}$, a negative value or 0 may be output.

The transistor 212 receives the first clock signal $clk_{PD}$ through a gate terminal and may have an end connected to the non-inverting terminal of the comparer 213. Depending on embodiments, the other end of the transistor may be connected to the ground terminal. Referring to FIG. 4, although the transistor 212 is shown as an NMOS, another kind of switch may be used, depending on embodiments.

As shown in FIG. 4, when the transistor 212 is an NMOS and a positive value of a predetermined magnitude or more is output as the first clock signal $clk_{PD}$, the transistor 212 may be turned on and electrically connect the non-inverting terminal of the comparer 213 to the ground terminal.

In the first flip-flop 214, the first clock signal $clk_{PD}$ may be input to a clock terminal and an input terminal and an inverting output terminal may be connected. The first flip-flop 214, the second flip-flop 215, and the third flip-flop 216, for example, may be D-flip-flops that are triggered to operate at rising edges of an input clock.

Since the input terminal and the inverting output terminal are connected to each other in the flip-flop 214, the output is inverted in accordance with generation of the first clock signal $clk_{PD}$.

In the second flip-flop 215, the second clock signal $clk_s$ may be input to a clock terminal, and an input terminal may be connected to the output terminal of the first flip-flop. The output of the second flip-flop 215 is determined in accordance with the second clock signal $clk_s$, so the second flip-flop 215 performs a function of synchronizing the first clock signal $clk_{PD}$ of which the generation time was random to the second clock signal $clk_s$ that is a reference signal.

In the third flip-flop 216, the second clock signal $clk_s$ may be input to a clock terminal, and an input terminal may be connected to the output terminal of the second flip-flop 215. The third flip-flop 216 may generate a signal for detecting the following XOR gate 217 by delaying the output of the second flip-flop 215 by one clock.

The XOR gate 217 may output a unit output signal $OUT_{LDC}$ by receiving input from the output terminal of the second flip-flop 215 and the output terminal of the third flip-flop 216. An output signal of the second flip-flop 215 and an output signal of the third flip-flop 216 have a large clock deference from the second clock signal $clk_s$, so they may create a unit output signal $OUT_{LDC}$ with predetermined intensity.

FIG. 5 is a diagram for illustrating the relationship of a first clock signal, a reference voltage, and a photodiode voltage.

When a photocurrent $I_{ph}$ is generated by light, which results in creation of a photodiode voltage $V_{PD}$ that is the anode voltage of the photodiode 211.

When the photodiode voltage $V_{PD}$ exceeds the reference voltage $V_{ref}$, the output of the comparer 213 operates the transistor 212, whereby the photodiode voltage $V_{PD}$ is initialized and short pulse output $clk_{PD}$ is created. For the comparer 213, for example, an active load amplifier followed by inverter stages may be implemented.

If the photodiode voltage $V_{PD}$ is smaller than the open voltage $V_{OC}$ of the unbiased photodiode 211, a rise of the photodiode voltage $V_{PD}$ depends on a photocurrent $I_{ph}$ and parasitic capacitance. Therefore, according to an embodiment, the reference voltage $V_{ref}$ is set lower than the open voltage $V_{oc}$, the frequency $f_{PD}$ of the first clock signal $clk_{PD}$ may be given a linear relationship with the light input.

Further, the first clock signal $clk_{PD}$ may be a delta-sigma modulated 1b stream, which is because the photodiode voltage $V_{PD}$ is the result of integration of the photocurrent $I_{ph}$, the comparer 213 operates as a 1b quantizer, and the reference voltage $V_{ref}$ is subtracted from the photodiode voltage $V_{PD}$ every time the first clock signal $clk_{PD}$ is set to 1.

The PPG signal generally has a large DC signal and a small AC signal and the photocurrent $I_{ph}$ is large enough to create the photodiode voltage $V_{PD}$. The design of the unbiased photodiode proposed in the present embodiment is more efficient in terms of power than the photoconductive configuration of the related art, which is because there is no photodiode biasing current requiring several to tens of uA due to the large DC component of the PPG signal.

FIG. 6 is a diagram for illustrating signal transmission relationship until a unit output signal is output.

FIG. 6 is a diagram for illustrating how a first signal $clk_{PD}$ that is asynchronous pulse output is synchronized. A node B is toggled every time the first signal $clk_{PD}$ that is an asynchronous pulse is generated from the comparer 213.

A unit output signal $OUT_{LDC}$ synchronized with the second clock signal $clk_s$ is created by following sampling and XOR gate operation for two outputs (C and D) through a cascaded flip-flop.

In order to prevent a loss of data during conversion from asynchronization (async) to synchronization (sync), the frequency of the second clock signal $clk_s$ needs to be higher twice the maximum frequency of the first clock signal $clk_{PD}$.

According to the configuration of the light-to-digital conversion unit 210a according to the present embodiment, the second clock signal $clk_s$ does not need to have a very high frequency. In this application, the second clock signal $clk_s$ may be set to 160 kHz. Increasing the frequency of the second clock signal $clk_s$ has an advantage in that it is possible to easily improve the dynamic range of a sensor because it does not influence on creation of the first clock signal $clk_{PD}$.

FIG. 7 is a diagram for illustrating an open voltage of a photodiode to an LED current value and FIG. 8 is a diagram for illustrating a short current of a photodiode to an LED current value.

It is assumed that an LED current value is in proportion to the intensity of LED light output.

FIGS. 7 and 8 are diagrams for illustrating measurement values of DC component characteristics of a PPG sensor and a photodiode of the present embodiment for LED light input. The target application is a reflective PPG, so a green LED was selected as a light source.

First, the open voltage $V_{OC}$ of a photodiode needs to be characterized to determine a reference voltage $V_{ref}$. Measurement of the open voltage Voc of light of low level starts from 250 mV, so the reference voltage $V_{ref}$ may be set as 200 mV (see FIG. 7).

A short current $I_{sc}$ and a digital output signal $OUT_{sensor}$ of a photodiode after off-chip low-pass-filtering are shown in FIG. 8, which shows that the proposed light-to-digital conversion based on an unbiased photodiode has preferable linearity. This result shows that a sensor can process a photocurrent of up to 10 uA in the present embodiment.

Since the frequency of the first clock signal $clk_{PD}$ should be lower than a half of the frequency of the second clock signal $clk_s$, the maximum DC output of each light-to-digital conversion unit corresponds to 0.5. Therefore, when there are 128 light-to-digital conversion units, 64(0.5×128) corresponds to the maximum DC value of the PPG sensor of the present embodiment.

In an actual application, due to on-chip variations and mismatches among light-to-digital conversion units, some light-to-digital conversion units experience saturation earlier than other light-to-digital conversion units, which may result in slight deterioration of linearity around the maximum value.

FIG. 9 is a diagram for illustrating the result of an FFT process on a unit output signal of three light-to-digital conversion units exemplarily selected and FIG. 10 is a diagram for illustrating the result of an FFT process on a digital output signal of a light-to-digital converter.

In this case, a 10 Hz-sine modulated LED light source was used as a light source.

The FFT result on three-unit output signals $OUT_{LDC}$ at different positions clearly shows $1^{st}$ order delta-sigma noise shaping (see FIG. 9). Since a high oversampling ratio of which the bandwidth is usually 10 Hz or lower is provided, a noise shaping property may be very suitable for a PPG application.

Different in-band noise floor levels were also observed due to mismatches and on-chip variations (see FIG. 9). Periodic spurs at high frequencies are well-known characteristics of a 1b-$1^{st}$ delta-sigma modulator. These spurs cause high noise levels after adding-up of a plurality of unit output signals, but may be removed through low-pass filtering. However, assuming that there are 128 light-to-digital conversion units 210, as shown in FIG. 10, the in-band random noise level has an advantage that it may be reduced maximally by 10 log (128) dB from the noise level of a unit due to an averaging effect by the distribution structure (see FIG. 3) of the present embodiment.

FIG. 11 is a diagram for illustrating a PPG signal measured at a wrist, FIG. 12 is a diagram for illustrating a PPG signal measured at a finger, and FIG. 13 is a table for comparing the performance of a light-to-digital converter according to an embodiment of the present invention and the related art.

The vertical axes mean the value of a digital output signal $OUT_{sensor}$ after low-pass filtering in FIGS. 11 and 12.

The monolithic sensor of the present application was manufactured through a standard CMOS logic process of 0.18 um, in which no additional following manufacturing process was applied. The total core area, which is 1.3×1.28 mm$^2$, includes the test circuit of a digital block. The power consumption changes from 14 uW to 25 uW, depending on a DC light level.

For performance comparison, equivalent current noise (18.2 pA$_{rms}$) was induced by using measurement of the short current to output $I_{sc}$-$OUT_{sensor}$ of FIG. 8 and measurement of an in-band noise level of FIG. 10. The monolithic PPG sensor according to the present application achieved six-time less power consumption and a twenty-five-time less noise level in comparison to the related art.

FIG. 14 is a diagram for illustrating an exemplary configuration of a light-to-digital conversion unit according to an embodiment of the present invention.

Referring to FIG. 14, It is possible to see a chip photomicrograph of a light-to-digital converter implemented in accordance with an application.

The accompanying drawings and the detailed description of the present invention were only examples of the present invention and were used to describe the present invention, not to limit meanings or the scope of the present invention described in claims. Accordingly, those skilled in the art would understand that various and equivalent modifications can be achieved from the embodiments. Therefore, the technical protective region of the present invention should be determined by the scope described in claims.

The invention claimed is:

1. A light-to-digital converter, comprising:
   a plurality of light-to-digital conversion units each creating a first clock signal by performing delta-sigma conversion on a photodiode voltage created from a photodiode, and outputting a unit output signal obtained by synchronizing the first clock signal with a second clock signal that is a reference clock signal; and
   an adder outputting a digital output signal by adding up the unit output signals of the plurality of light-to-digital conversion units,
   wherein a cathode of the photodiode is connected to a ground terminal and an anode of the photodiode is not biased,
   wherein each of the plurality of light-to-digital conversion units has a non-inverting terminal connected with an anode of the photodiode and an inverting terminal connected with a reference voltage and further includes a comparer, and
   wherein each of the plurality of light-to-digital conversion units further includes a first flip-flop receiving input of the first clock signal through a clock terminal and having an input terminal and an inverting output terminal connected with each other.

2. The light-to-digital converter of claim 1, wherein light-incident surfaces of the plurality of digital conversion units are disposed in an array format with respect to one plane.

3. The light-to-digital converter of claim 1, wherein each of the plurality of light-to-digital conversion units further includes a transistor receiving input of the first clock signal through a gate terminal and having one end connected to a non-inverting terminal of the comparer.

4. The light-to-digital converter of claim 3, wherein the cathode of the photodiode and the other end of the transistor of each of the plurality of digital conversion units are connected to the ground terminal.

5. The light-to-digital converter of claim 1, wherein each of the plurality of light-to-digital conversion units further includes a second flip-flop receiving input of the second clock signal through the clock terminal and having the input terminal connected with an output terminal of the first flip-flop.

6. The light-to-digital converter of claim 5, wherein each of the plurality of light-to-digital conversion units further includes a third flip-flop receiving input of the second clock signal through the clock terminal and having the input terminal connected with an output terminal of the second flip-flop.

7. The light-to-digital converter of claim 6, wherein each of the plurality of light-to-digital conversion units further includes an XOR gate outputting a unit output signal by receiving input from the output terminal of the second flip-flop and the output terminal of the third flip-flop.

8. A light-to-digital conversion unit comprising:
a photodiode;
a comparer having a non-inverting terminal with an anode of the photodiode and an inverting terminal connected with a reference voltage, and outputting a first clock signal;
a transistor receiving input of the first clock signal through a gate terminal and having one end connected with the non-inverting terminal of the comparer;
a first flip-flop receiving input of the first clock signal through a clock terminal and having an input terminal and an inverting output terminal connected to each other;
a second flip-flop receiving input of a second clock signal through the clock terminal and having the input terminal connected with an output terminal of the first flip-flop;
a third flip-flop receiving input of the second clock signal through the clock terminal and having the input terminal connected with an output terminal of the second flip-flop; and
an XOR gate outputting a unit output signal by receiving input from the output terminal of the second flip-flop and the output terminal of the third flip-flop,
wherein a cathode of the photodiode is connected to a ground terminal and the anode of the photodiode is not biased.

9. The light-to-digital conversion unit of claim 8, wherein the cathode of the photodiode and the other end of the transistor are connected to the ground terminal.

* * * * *